(12) United States Patent
Darveaux et al.

(10) Patent No.: US 8,536,458 B1
(45) Date of Patent: Sep. 17, 2013

(54) FINE PITCH COPPER PILLAR PACKAGE AND METHOD

(75) Inventors: Robert Francis Darveaux, Gilbert, AZ (US); David McCann, Chandler, AZ (US); John McCormick, Chandler, AZ (US); Louis W. Nicholls, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 453 days.

(21) Appl. No.: 12/414,220

(22) Filed: Mar. 30, 2009

(51) Int. Cl.
*H05K 1/03* (2006.01)
*H05K 1/11* (2006.01)

(52) U.S. Cl.
USPC .......................................... 174/255; 174/267

(58) Field of Classification Search
USPC ......... 174/255, 267, 257; 257/665; 439/371; 228/182; 361/771, 772, 774
See application file for complete search history.

(56) References Cited

U.S. PATENT DOCUMENTS

| | | | |
|---|---|---|---|
| 5,334,804 A | 8/1994 | Love et al. | |
| 5,422,516 A * | 6/1995 | Hosokawa et al. | 257/775 |
| 5,796,591 A | 8/1998 | Dalal et al. | |
| 5,889,326 A | 3/1999 | Tanaka | |
| 5,920,126 A | 7/1999 | Sohara | |
| 5,969,952 A * | 10/1999 | Hayashi et al. | 361/774 |
| 6,049,122 A | 4/2000 | Yoneda | |
| 6,229,711 B1 | 5/2001 | Yoneda | |
| 6,287,893 B1 * | 9/2001 | Elenius et al. | 257/738 |
| 6,346,435 B1 | 2/2002 | Kikuchi et al. | |
| 6,365,435 B1 | 4/2002 | Wang et al. | |
| 6,462,426 B1 | 10/2002 | Kelkar et al. | |
| 6,467,676 B1 | 10/2002 | Wang | |
| 6,479,900 B1 | 11/2002 | Shinogi et al. | |
| 6,495,397 B2 | 12/2002 | Kubota et al. | |
| 6,510,976 B2 | 1/2003 | Hwee et al. | |
| 6,550,666 B2 | 4/2003 | Chew et al. | |
| 6,578,754 B1 | 6/2003 | Tung | |
| 6,592,019 B2 | 7/2003 | Tung | |
| 6,599,775 B2 | 7/2003 | Tie et al. | |
| 6,681,982 B2 | 1/2004 | Tung | |

(Continued)

FOREIGN PATENT DOCUMENTS

| | | |
|---|---|---|
| JP | 11-074301 | 3/1999 |
| JP | 2001-068508 | 3/2001 |

OTHER PUBLICATIONS

Sohn et al., "Semiconductor Device Capable of Preventing Dielectric Layer From Cracking", U.S. Appl. No. 13/049,647, filed Mar. 16, 2011.

*Primary Examiner* — Timothy Thompson
*Assistant Examiner* — Roshn Varghese
(74) *Attorney, Agent, or Firm* — McKay and Hodgson, LLP; Serge J. Hodgson

(57) ABSTRACT

An electronic component package includes a substrate having an upper surface. Traces on the upper surface of the substrate extend in a longitudinal direction. The traces have a first latitudinal width in a latitudinal direction, the latitudinal direction being perpendicular to the longitudinal direction. Rectangular copper pillars are attached to bond pads of an electronic component, the copper pillars having a longitudinal length and a latitudinal second width. The latitudinal second width of the copper pillars is equal to and aligned with the first latitudinal width of the traces. Further, the longitudinal length of the copper pillars is parallel with the longitudinal direction of the trace and equal to the length of the bond pads. The copper pillars are mounted to the traces with solder joints.

18 Claims, 6 Drawing Sheets

(56) References Cited

U.S. PATENT DOCUMENTS

| | | |
|---|---|---|
| 6,732,913 B2 | 5/2004 | Alvarez |
| 6,734,039 B2 | 5/2004 | Hwee et al. |
| 6,750,082 B2 | 6/2004 | Briar et al. |
| 6,786,736 B2 * | 9/2004 | Flannery et al. ............. 439/66 |
| 6,929,981 B2 | 8/2005 | Hwee et al. |
| 7,087,458 B2 | 8/2006 | Wang et al. |
| 7,183,493 B2 * | 2/2007 | Garcia et al. ............. 174/257 |
| 7,183,648 B2 | 2/2007 | Ramanathan et al. |
| 7,362,038 B1 | 4/2008 | Jang et al. |
| 7,391,112 B2 | 6/2008 | Li et al. |
| 7,456,496 B2 | 11/2008 | Hwee et al. |
| 7,462,942 B2 | 12/2008 | Tan et al. |
| 7,795,071 B2 | 9/2010 | Hwee-Seng Jimmy et al. |
| 2005/0077624 A1 | 4/2005 | Tan et al. |
| 2005/0098886 A1 * | 5/2005 | Pendse ............. 257/738 |
| 2007/0096316 A1 | 5/2007 | Schofield et al. |
| 2008/0136019 A1 | 6/2008 | Johnson et al. |

* cited by examiner

FINE PITCH COPPER PILLAR PACKAGE AND METHOD

BACKGROUND OF THE INVENTION

1. Field of the Invention

The present application relates to the field of electronics, and more particularly, to methods of forming electronic component packages and related structures.

2. Description of the Related Art

Fine pitch flip chip technology requires very tight pad to pad spacing on the substrate and very tight bond pad to bond pad spacing on the integrated circuit chip. The pads of the substrate are electrically and physically connected to the bond pads of the integrated circuit chip using fine pitch solder bumps.

These fine pitch solder bumps are delicate and prone to failure due to the differential thermal expansion between the substrate and the integrated circuit chip. More particularly, the load bearing area of the solder bumps is very small and thus the stresses applied thereon are very high due to the thermal expansion mismatch between the integrated circuit chip and the substrate.

To increase the load bearing area of the solder bumps, the diameter of the solder bumps is increased. However, increasing the diameter of the solder bumps decreases the spacing between adjacent solder bumps and between the solder bumps and adjacent traces. Accordingly, the potential for shorting between adjacent solder bumps and between solder bumps and adjacent traces increases.

SUMMARY OF THE INVENTION

In accordance with one embodiment, an electronic component package includes a substrate having an upper surface. Traces on the upper surface of the substrate extend in a longitudinal direction. The traces have a first latitudinal width in a latitudinal direction, the latitudinal direction being perpendicular to the longitudinal direction.

The electronic component package further includes an electronic component having bond pads. Rectangular copper pillars are attached to the bond pads, the copper pillars having a longitudinal length and a latitudinal second width. The latitudinal second width of the copper pillars is equal to and aligned with the first latitudinal width of the traces. Further, the longitudinal length of the copper pillars is parallel with the longitudinal direction of the trace and equal to the length of the bond pads. The copper pillars are mounted to the traces with solder joints.

By forming the longitudinal length of the copper pillars equal to the length of the bond pad and the latitudinal second width of the copper pillars equal to and aligned with the first latitudinal width of the traces, the load bearing area of the copper pillars on both the bond pads and traces is maximized. By maximizing the load bearing area of the copper pillars, the copper pillars provide robust interconnections that withstand stress due to the differential thermal expansion between the substrate and the electronic component.

Further, by forming the latitudinal second width of the copper pillars equal to and aligned with the first latitudinal width of the traces, the spacing between adjacent copper pillars and between copper pillars and adjacent traces is equal to the spacing between adjacent traces. Accordingly, the potential for shorting between adjacent copper pillars and between copper pillars and adjacent traces is essentially eliminated.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
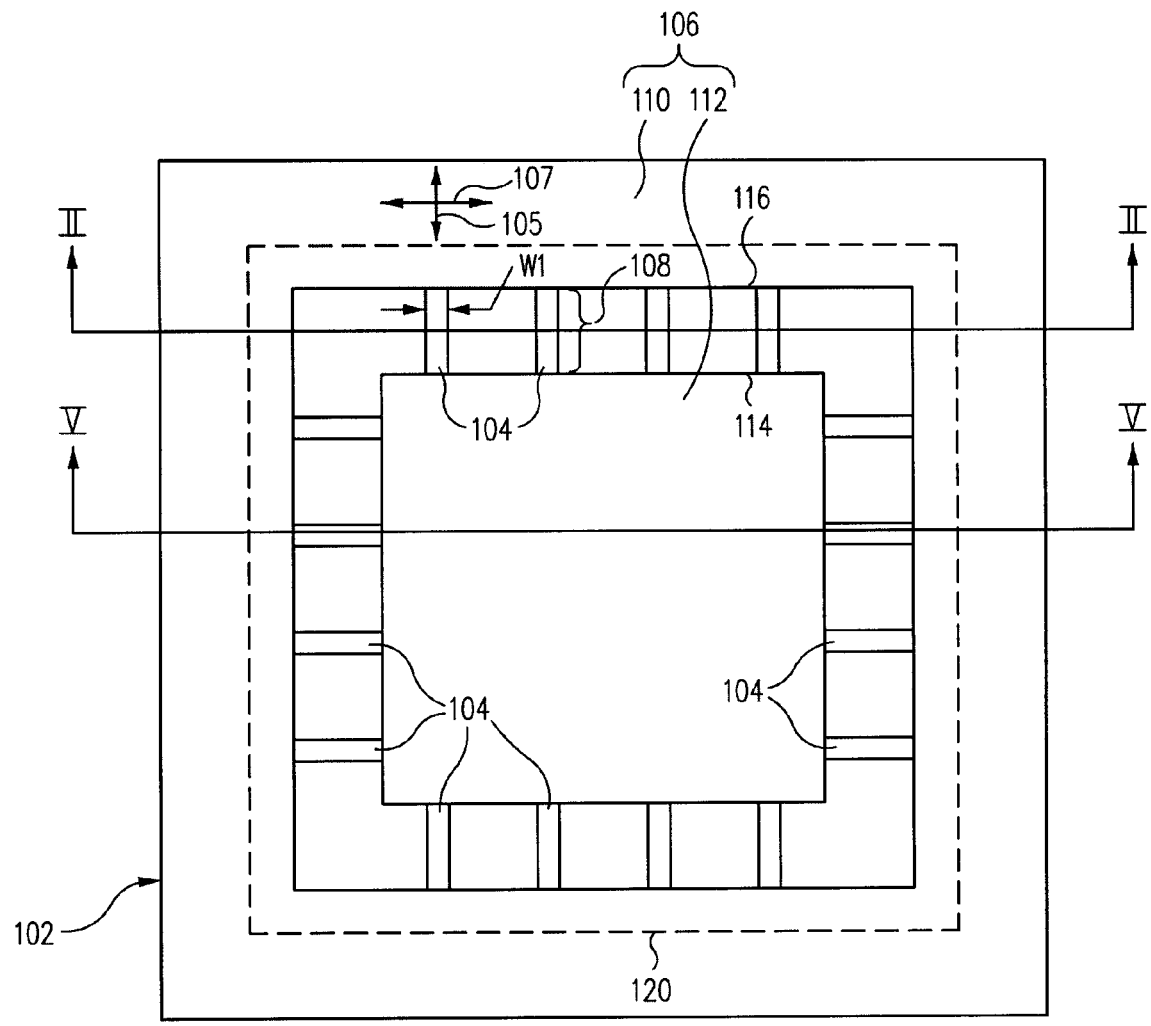
FIG. 1 is top plan view of a fine pitch copper pillar package in accordance with one embodiment.
Figure 2:
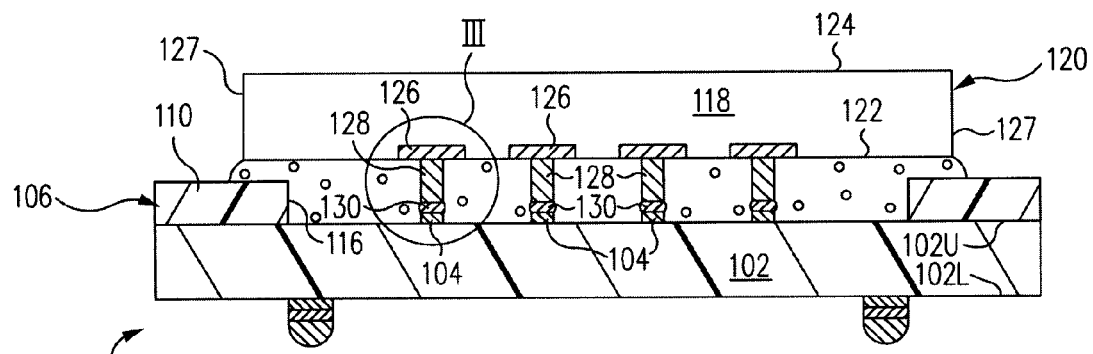
FIG. 2 is a cross-sectional view of the fine pitch copper pillar package along the line II-II of FIG. 1 in accordance with one embodiment.

FIG. 1 is top plan view of a fine pitch copper pillar package 100 in accordance with one embodiment. FIG. 2 is a cross-sectional view of fine pitch copper pillar package 100 along the line II-II of FIG. 1 in accordance with one embodiment.

Referring now to FIGS. 1 and 2 together, fine pitch copper pillar package 100, sometimes called an electronic component package, includes a substrate 102 including an upper, e.g., first, surface 102U and an opposite lower, e.g., second, surface 102L. Substrate 102 is a dielectric material such as laminate, ceramic, printed circuit board material, or other dielectric material.

Formed on upper surface 102U of substrate 102 are electrically conductive upper, e.g., first, traces 104. Also formed on upper surface 102U is a dielectric solder mask 106. Solder mask 106 has formed therein a window 108, sometimes called an opening or a trench in solder mask 106. Portions of upper traces 104 are exposed through window 108 thus facilitating electrical connection with upper traces 104. Solder mask 106 is sometimes called a trench solder mask.

In accordance with this embodiment, window 108 is a rectangular annulus. Accordingly, solder mask 106 includes an outer rectangular annular portion 110 and a central rectangular portion 112. Window 108 is defined between outer rectangular annular portion 110 and central rectangular portion 112. More particularly, an outer rectangular periphery 114 of central rectangular portion 112 and an inner rectangular periphery 116 of outer rectangular annular portion 110 define window 108. However, in other embodiments, window 108 is one or more rectangular channels or other openings that selectively expose portions of upper traces 104.

As illustrated in FIG. 1, upper traces 104 extend in the longitudinal direction 105 perpendicularly outwards across window 108. More particularly, upper traces 104 longitudinally extend perpendicularly between outer rectangular periphery 114 of central rectangular portion 112 and inner rectangular periphery 116 of outer rectangular annular portion 110. Further, upper traces 104 have a first width W1 in the latitudinal direction 107. The term longitudinal means "along the major (or long) axis" as opposed to latitudinal which means "along the width", transverse, or across. Thus, the longitudinal direction is perpendicular to the latitudinal direction.

Note that direction 105 is the longitudinal direction for upper traces 104 at the top and bottom in the view of FIG. 1 and the latitudinal direction for upper traces 104 at the right and left in the view of FIG. 1. Similarly, direction 107 is the latitudinal direction for upper traces 104 at the top and bottom in the view of FIG. 1 and the longitudinal direction for upper traces 104 at the right and left in the view of FIG. 1.

Fine pitch copper pillar package 100 further includes an electronic component 118. For clarity of illustration, only the outer periphery 120 of electronic component 118 is illustrated in FIG. 1 to allow visualization of the features of substrate 102.

In one embodiment, electronic component 118 is an integrated circuit chip, e.g., an active component. However, in other embodiments, electronic component 118 is a passive component such as a capacitor, resistor, or inductor.

In accordance with this embodiment, electronic component 118 includes an active surface 122 and an opposite inactive surface 124. Electronic component 118 further includes bond pads 126 formed on active surface 122.

Electronic component 118 further includes sides 127 extending perpendicularly between active surface 122 and inactive surface 124. Sides 127 define outer periphery 120 of electronic component 118. More particular, the intersection of active surface 122 and sides 127 and the intersection of inactive surface 124 and sides 127 define outer periphery 120 of active surface 122 and outer periphery 120 of inactive surface 124, respectively.

Figure 3:
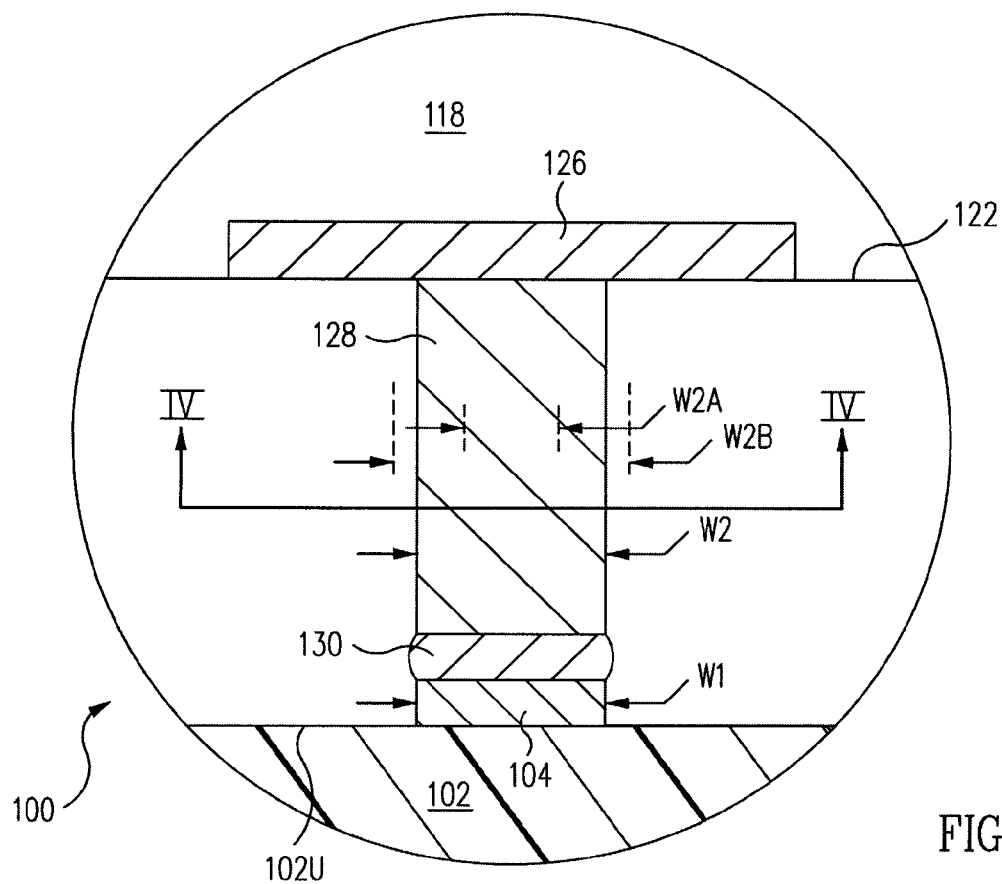
FIG. 3 is an enlarged cross-sectional view of the region III of the fine pitch copper pillar package of FIG. 2 in accordance with one embodiment.

FIG. 3 is an enlarged cross-sectional view of the region III of fine pitch copper pillar package 100 of FIG. 2 in accordance with one embodiment. Referring now to FIGS. 1, 2 and 3 together, electronic component 118 is flip chip mounted to substrate 102. More particularly, bond pads 126 are mounted to upper traces 104 by electrically conductive copper pillars 128 and electrically conductive solder joints 130.

Copper pillars 128 are formed directly on bond pads 126, e.g., by plating. Solder joints 130 electrically and physically connect copper pillars 128 to upper traces 104. Copper pillars 128 are formed of copper.

In one embodiment, rectangular openings are formed in a resist on active surface 122 of electronic component 118 using any one of a number of techniques, e.g., using photolithography. The rectangular openings expose portions of bond pads 126. The rectangular openings are filled with copper, e.g., by plating. The resist is stripped, leaving copper pillars 128 on bond pads 126.

Solder joints 130 melt at a lower temperature than copper pillars 128. To mount electronic component 118 to substrate 102, solder joints 130 are placed between respective upper traces 104 and copper pillars 128. In one embodiment, solder joints 130 are formed on copper pillars 128. In another embodiment, solder joints 130 are formed on upper traces 104. In either embodiment, the assembly is heated thus reflowing (melting and solidifying) solder joints 130 thus physically and electrically connecting, i.e., mounting, copper pillars 128 to respective upper traces 104.

During this reflow process, copper pillars 128 are not melted. Accordingly, copper pillars 128 provide a fixed standoff for electronic component 118, i.e., provide a fixed distance between active surface 122 of electronic component 118 and upper surface 102U of substrate 102. Further, by not melting copper pillars 128, copper pillars 128 maintain their shape. Thus, the spacing between adjacent copper pillars 128 and between copper pillars 128 and adjacent upper traces 104 is maintained as discussed further below.

Although copper is set forth, in another embodiment, pillars 128 are formed of an electrically conductive material other than copper such as copper alloy and other materials having a melting temperature greater than solder joints 130.

Figure 4:
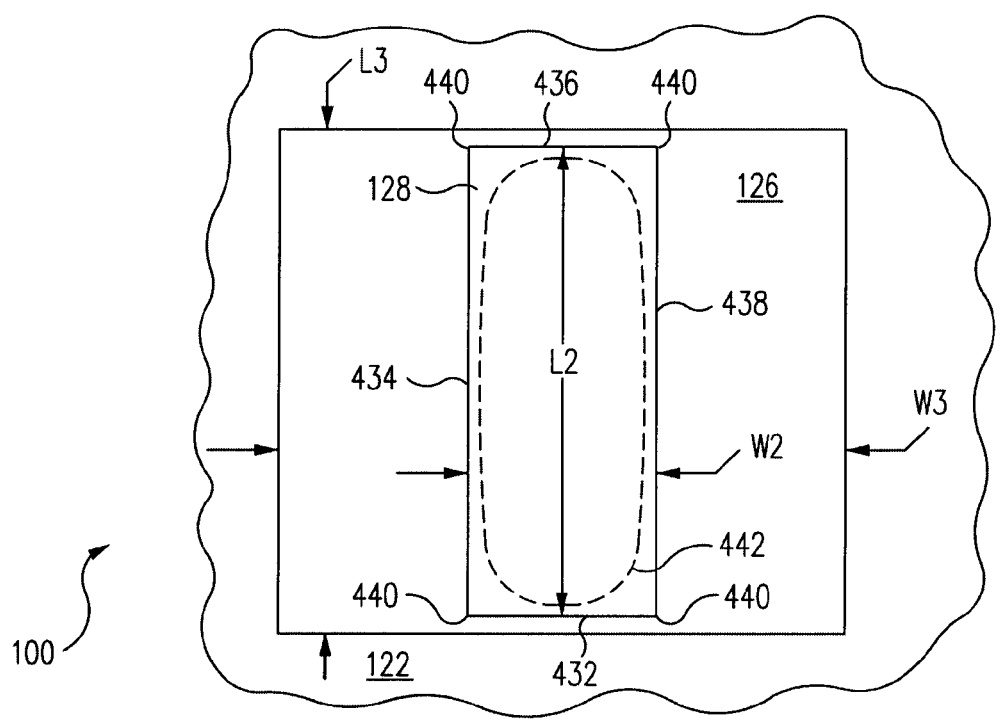
FIG. 4 is a cross-sectional view of a copper pillar of the fine pitch copper pillar package of FIG. 3 along the line IV-IV in accordance with one embodiment.

FIG. 4 is a cross-sectional view of a copper pillar 128 of fine pitch copper pillar package 100 of FIG. 3 along the line IV-IV in accordance with one embodiment. Referring now to FIGS. 3 and 4, copper pillar 128 is rectangular in cross-section having a latitudinal width W2 and a longitudinal length L2. As set forth above, the term longitudinal means "along the major (or long) axis" as opposed to latitudinal which means "along the width", transverse, or across.

Length L2 is greater than width W2. In one embodiment, length L2 is 50 micrometers (μm) and width W2 is 20 μm. In another embodiment, length L2 is 70 micrometers (μm) and width. W2 is 35 μm. Although examples of particular dimensions for length L2 and width W2 are set forth, the examples are illustrative only, and other dimensions are used in other embodiments.

Further, width W2 of copper pillar 128 is equal to and aligned with width W1 of upper trace 104. Accordingly, copper pillar 128 is located within the area of upper trace 104, i.e., does not protrude in the latitudinal direction outwards beyond upper trace 104, i.e., the edges thereof.

Further, length L2 of copper pillar 128 is parallel with the longitudinal direction, sometimes called the length, of upper trace 104. Although the terms equal, parallel, perpendicular, and similar terms are used herein to describe various features, in light of this disclosure, those of skill in the art will understand that the features may not be exactly equal, parallel, perpendicular but only approximately equal, parallel, perpendicular to within accepted manufacturing tolerances.

Copper pillar 128 is defined by four straight sidewalls 432, 434, 436, 438 in accordance with this embodiment. Sidewalls 432, 436 are parallel to one another and separated by a distance equal to length L2. Sidewalls 434, 438 are parallel to one another and separated by a distance equal to width W2. Sidewalls 434, 438 are perpendicular to sidewalls 432, 436. Corners 440, e.g., sharp 90° corners, straight edges, curved edges, and rounded corners, are defined at the intersection of sidewalls 434, 438 and sidewalls 432, 436.

As further illustrated in FIG. 4, bond pad 126 is rectangular, e.g., square, in accordance with this embodiment. Bond pad 126 has a width W3 and a length L3. In accordance with one embodiment, width W3 is equal to length L3 although has other dimensions in other embodiments.

Further, in accordance with this embodiment, length L2 of copper pillar 128 is equal to length L3 of bond pad 126. However, width W3 of bond pad 126 is greater than width W2 of copper pillar 128. In other embodiments, length L2 of copper pillar 128 is less than or greater than length L3 of bond pad 126. Further, in other embodiments, width W3 of bond pad 126 is equal to or less than width W2 of copper pillar 128.

By forming length L2 of copper pillar 128 equal to length L3 of bond pad 126 and width W2 of copper pillar 128 equal to width W1 of upper trace 104, the load bearing area of copper pillar 128 on both bond pad 126 and upper trace 104 is increased as compared to formation of a cylindrical solder bump having a diameter equal to width W1 of upper trace 104. By maximizing the load bearing area of copper pillar 128, copper pillar 128 provides a robust interconnection that withstands stress due to the differential thermal expansion between substrate 102 and electronic component 118.

Further, by forming copper pillar 128 with width W2 equal to and aligned with width W1 of upper trace 104, the spacing between adjacent copper pillars 128 and between copper pillars 128 and adjacent upper traces 104 is equal to the spacing between adjacent upper traces 104. Accordingly, the potential for shorting between adjacent copper pillars 128 and between copper pillars 128 and adjacent upper traces 104 is essentially eliminated. As a result, fine pitch copper pillar package 100 is reliable and formed with a high process yield.

Paying particular attention now to FIG. 3, in another embodiment, copper pillar 128 has a width W2A. In accordance with this embodiment, width W2A of copper pillar 128 is less than width W1 of upper trace 104. Accordingly, copper pillar 128 is located inward of the edge(s) of upper trace 104 in accordance with this embodiment.

In yet another embodiment, copper pillar 128 has a width W2B. In accordance with this embodiment, width W2B of copper pillar 128 is greater than width W1 of upper trace 104. Accordingly, copper pillar 128 overhangs outwards beyond the edge(s) of upper trace 104 in accordance with this embodiment.

Although copper pillar 128 is set forth above as being rectangular, paying particular attention to FIG. 4, in another embodiment, copper pillar 128 is oval in cross-section having a latitudinal width W2 and a longitudinal length L2 as indicated by the dashed oval 442. Generally, copper pillar 128 is rectangular or oval or any shape between rectangular and oval including rectangular with rounded edges or other shape.

Figure 5:
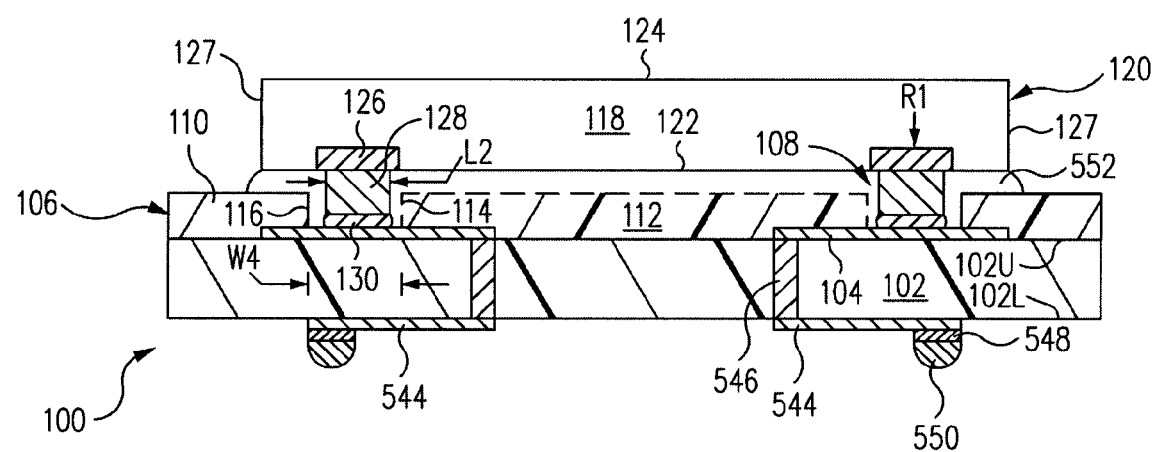
FIG. 5 is a cross-sectional view of the fine pitch copper pillar package along the line V-V of FIG. 1 in accordance with one embodiment.

FIG. 5 is a cross-sectional view of fine pitch copper pillar package 100 along the line V-V of FIG. 1 in accordance with one embodiment. Referring now to FIG. 5, formed on lower surface 102L of substrate 102 are lower traces 544. Lower traces 544 are electrically connected to upper traces 104 by electrically conductive vias 546 extending through substrate 102 between upper surface 102U and lower surface 102L. Formed on lower traces 544 are pads 548, e.g., lands. Formed on pads 548 are interconnection balls 550, e.g., solder balls. Although not illustrated in FIG. 5, in one embodiment, fine pitch copper pillar package 100 further includes a lower solder mask on lower surface 102L that protects lower traces 544.

Although a particular electrically conductive pathway between upper traces 104 and interconnection balls 550 is described above, other electrically conductive pathways can be formed. For example, contact metallizations can be formed between the various electrical conductors. Alternatively, pads 548 are not formed and interconnection balls 550 are formed directly on lower traces 544.

Further, instead of straight though vias 546, in one embodiment, substrate 102 is a multilayer laminate substrate and a plurality of vias and/or internal traces form the electrical interconnection between upper traces 104 and lower traces 544.

In yet another embodiment, interconnection balls 550 are distributed in an array format to form a ball grid array (BGA) type package. Alternatively, interconnection balls 550 are not formed, e.g., to form a metal land grid array (LGA) type package. In yet another alternative, pads 548 and interconnection balls 550 are not formed, e.g., to form a leadless chip carrier (LCC) type package. BGA, LGA and LCC type packages are well known to those of skill in the art. Other electrically conductive pathway modifications will be obvious to those of skill in the art in light of this disclosure.

Further, as illustrated FIG. 5, in accordance with this embodiment, length L2 of copper pillars 128 is less than the width W4 of window 108 allowing copper pillars 128 to fit within window 108. More particularly, width W4 is equal to the distance between outer rectangular periphery 114 of central rectangular portion 112 and inner rectangular periphery 116 of rectangular annular portion 110 of solder mask 106.

Referring now to FIGS. 1 and 5 together, in another embodiment, central rectangular portion 112 of solder mask 106 is not formed. Accordingly, central rectangular portion 112 is illustrated as a dashed line in FIG. 5 to indicate that formation of central rectangular portion 112 is optional.

In the event that central rectangular portion 112 is not formed, rectangular annular portion 110 forms the entire solder mask 106. Further, in this event, window 108 is defined by inner rectangular periphery 116 of rectangular annular portion 110.

As also illustrated in FIG. 5, in one embodiment, an underfill 552 is applied. Underfill 552 fills the space between active surface 122 of electronic component 118 and upper surface 102U of substrate 102. Underfill 552 encloses and protects copper pillars 128 and solder joints 130. Underfill 552 is optional, and in one embodiment, is not formed.

In the embodiment illustrated in FIGS. 1-5, a single row R1 of bond pads 126 are formed adjacent each of sides 127, i.e., adjacent to outer periphery 120 of active surface 122. Accordingly, fine pitch copper pillar package 100 is sometimes called a fine pitch perimeter in-line copper pillar layout design. As discussed in greater detail below in reference to FIG. 6, in another embodiment, bond pads 126 are formed in a plurality of staggered rows.

Figure 6:
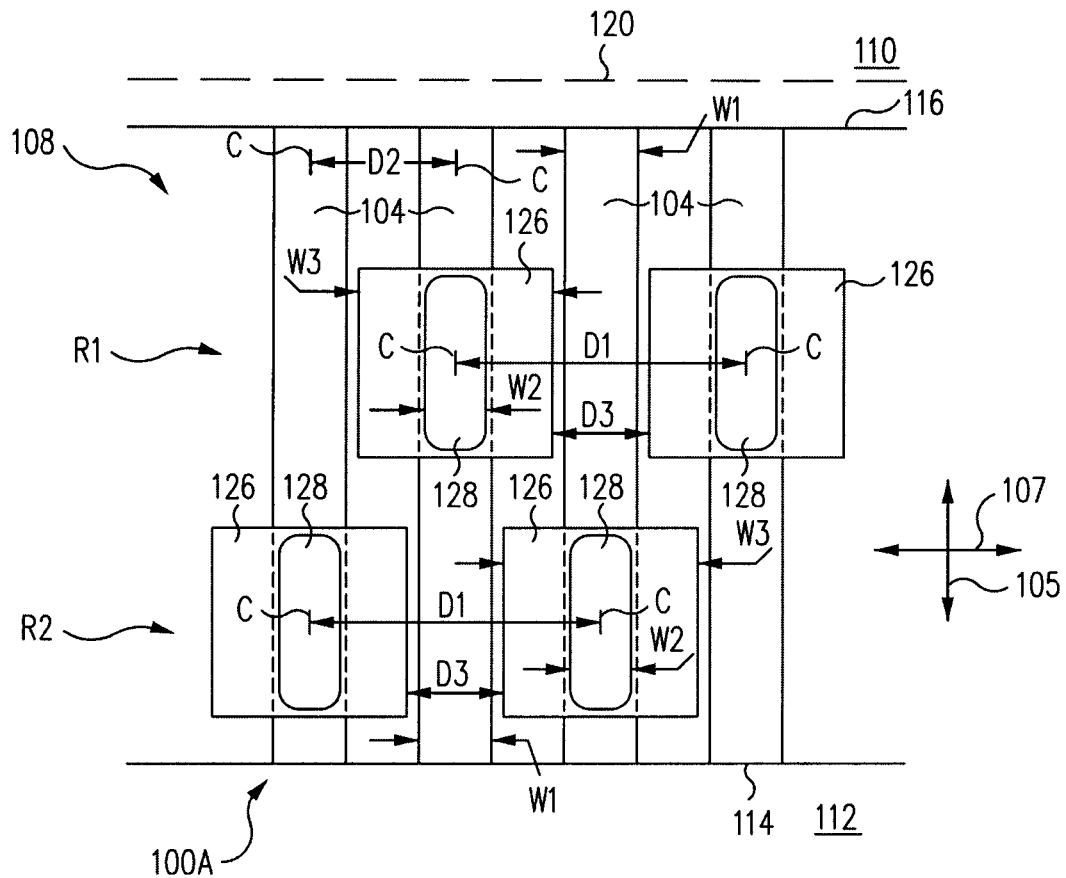
FIG. 6 is a top perspective view of staggered copper pillars of a fine pitch copper pillar package in accordance with another embodiment.

FIG. 6 is a top perspective view of staggered copper pillars 128 of a fine pitch copper pillar package 100A in accordance with another embodiment. Fine pitch copper pillar package 100A of FIG. 6 is similar to fine pitch copper pillar package 100 of FIGS. 1-5 and only the significant differences between packages 100A, 100 are discussed below. Fine pitch copper pillar package 100A is sometimes called a fine pitch perimeter staggered copper pillar layout design.

In the view of FIG. 6, bond pads 126, copper pillars 128 and upper traces 104 are illustrated although it is to be understood that the features would normally not be visible in the view of FIG. 6 as bond pads 126, copper pillars 128 and upper traces 104 would be covered by the remainder of electronic component 118 or each other.

Referring now to FIG. 6, bond pads 126 are arranged in two staggered rows R1 and R2. Outer row R1 of bond pads 126 is adjacent to outer periphery 120 of electronic component 118. Inner row R2 of bond pads 126 is inward of outer row R1. Accordingly, outer row R1 of bond pads 126 is between outer periphery 120 of electronic component 118 and inner row R2 of bond pads 126. Although two rows R1, R2 of bond pads 126 are illustrated, generally, there are multiple rows of bond pads 126, e.g., two, three, four or more rows of bond pads 126.

Bond pads 126 of outer row R1 are mounted to every other upper trace 104. Similarly, bond pads 126 of inner row R2 are mounted to every other upper trace 104. Accordingly, bond pads 126 of outer row R1 are said to be staggered as compared to bond pads 126 of inner row R2.

In accordance with this embodiment, the distance D1, sometimes called pitch, between the center C of adjacent bond pads 126 of outer row R1 and inner row R2 is equal to twice the distance D2, sometimes called pitch, between the center C of adjacent upper traces 104.

Further, the distance D3 between adjacent bond pads 126 of outer row R1 and between adjacent bond pads 126 of inner row R2 is approximate equal to but slightly greater than width W1 of upper traces 104. Further, distance D3 is less than width W3 of bond pads 126. Accordingly, there is a latitudinal overlap of at least some of bond pads 126 of inner row R2 and at least some of bond pad 126 of outer row R1. Stated another way, portions of at least some of bond pads 126 are between outer periphery 120 and portions of bond pads 126 of inner row R2.

Although various dimensions are provided above for staggered bond pads 126 of outer row R1 and inner row R2 and for upper traces 104, the dimensions are illustrative only, and other dimensions are used in other embodiments. More particularly, the dimensions D1, D2, D3, W1, W2, W2 and the relationships between the dimensions D1, D2, D3, W1, W2, W2 are illustrative only and dimensions D1, D2, D3, W1, W2, W2 and the relationships between the dimensions D1, D2, D3, W1, W2, W2 are different in other embodiments.

Upper traces 104 extend longitudinally between outer rectangular periphery 114 of central rectangular portion 112 of solder mask 106 and inner rectangular periphery 116 of outer rectangular annular portion 110 of solder mask 106. More particularly, upper traces 104 extend longitudinally across window 108.

As illustrated, width W2 of copper pillars 128 is equal to and aligned with width W1 of upper traces 104. Thus, the spacing between copper pillar 128 and adjacent upper traces 104 is equal to the spacing between adjacent upper traces 104. Accordingly, the potential for shorting between copper pillars 128 and adjacent upper traces 104 is essentially eliminated.

Figure 7:
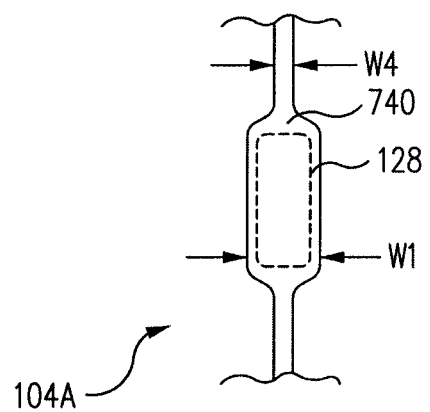
FIG. 7 is a top perspective view of an upper trace comprising a substrate pad for a fine pitch copper pillar package in accordance with another embodiment.

FIG. 7 is a top perspective view of an upper trace 104A comprising a substrate pad 740 for a fine pitch copper pillar package in accordance with another embodiment. As illustrated, substrate pad 740 is wider having a larger width W1 as compared to width W4 of the remainder of upper trace 104A. Copper pillar 128 (copper pillar 128 is illustrated as a dashed rectangle) is mounted to substrate pad 740 using solder joint 130. Accordingly, substrate pad 740 provides a larger contact area for copper pillar 128. Although direct connection of copper pillars 128 to upper traces 104 using solder joints 130 is set forth above, in light of this disclosure, it is to be understood that upper traces 104 in the embodiments illustrated in FIGS. 1-6 can be formed with substrate pads 740 for connection with copper pillars 128 using solder joint 130 as illustrated in FIG. 7.

Figure 8:
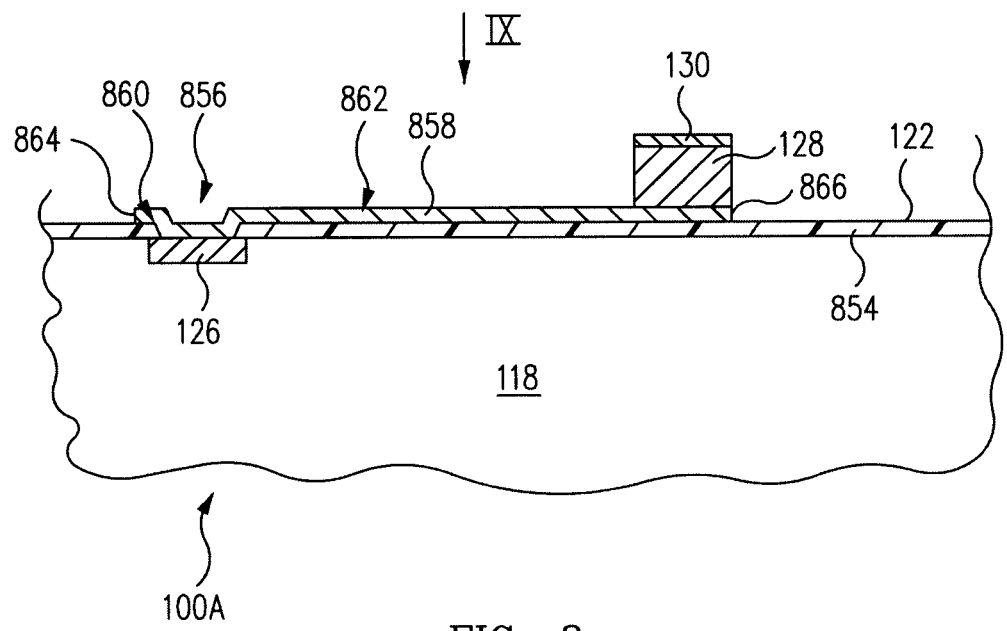
FIG. 8 is a cross-sectional view of the electronic component of a fine pitch copper pillar package in accordance with another embodiment.
Figure 9:
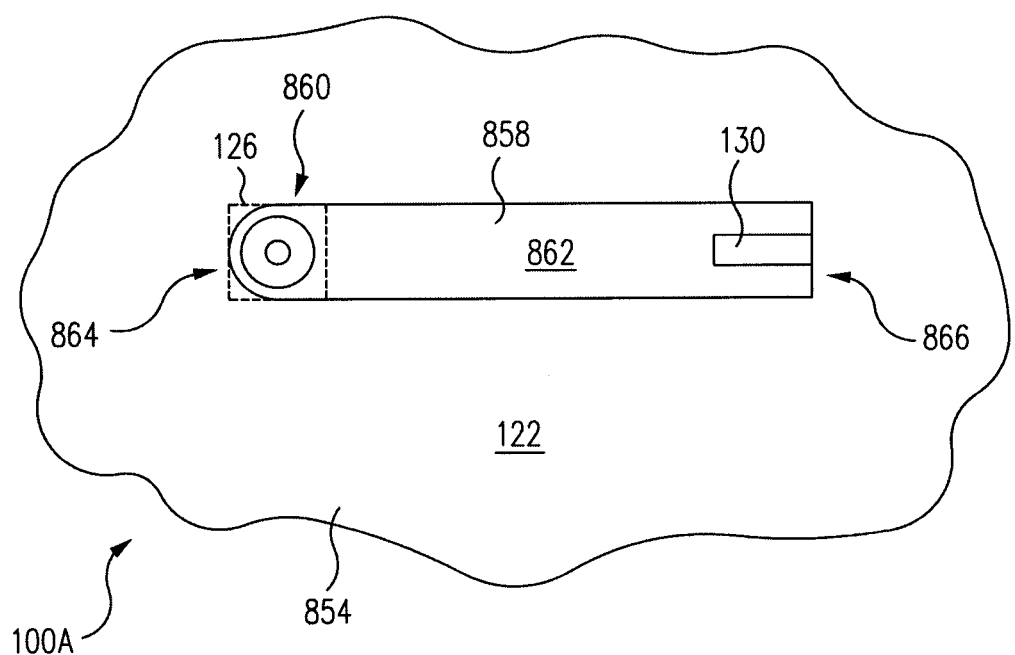
FIG. 9 is a top plan view of the electronic component taken along the arrow IX of FIG. 8.

FIG. 8 is a cross-sectional view of electronic component 118 of a fine pitch copper pillar package 100A in accordance with another embodiment. FIG. 9 is a top plan view of electronic component 118 taken along the arrow IX of FIG. 8. Referring now to FIGS. 8 and 9 together, active surface 122 includes a passivation layer 854 formed thereon. Passivation layer 854 is a dielectric material.

Passivation layer 854 is patterned to form an opening 856 in passivation layer 854. Opening 856 is formed corresponding to bond pad 126 such that bond pad 126 (illustrated in a dashed rectangle in FIG. 9) is exposed through opening 856.

Electrically conductive Under Bump Metallization (UBM) 858 extends through opening 856 to contact and be electrically connected to bond pad 126. In accordance with this embodiment, UBM 858 includes a bond pad contact portion 860 and a UBM extension portion 862. Bond pad contact portion 860 contacts bond pad 126 and is at a first end 864 of UBM 858. UBM extension portion 862 extends longitudinally on passivation layer 854 from bond pad contact portion 860 to a second end 866 of UBM 858.

Copper pillar 128 and solder joint 130 are formed on UBM extension portion 862 at second end 866. In this manner, copper pillar 128 is offset, sometimes called separated from or located at a distance from, bond pad 126. UBM 858 attaches copper pillar 128 to bond pad 126.

By offsetting copper pillar 128 from bond pad 126, stress imparted upon copper pillar 128 is offset from bond pad 126. More particularly, instead of having stress imparted upon copper pillar 128 imparted directly to bond pad 126, by offsetting copper pillar 128, the stress is imparted to passivation layer 854. In one embodiment, passivation layer 854 has a lower modulus of elasticity and thus a higher elasticity than the bulk, e.g., silicon, of electronic component 118. Accordingly, passivation layer 854 is more resilient to stress than the bulk, e.g., silicon, of electronic component 118 thus providing a cushion to absorb stress between substrate 102 and electronic component 118. At the same time, the pitch of copper pillars 128 is minimized.

Formation of copper pillars 128 on UBM 858 and offset from bond pads 126 allows the longitudinal length of copper pillars 128 to be increased at high stress locations, e.g., at the corners of electronic component 118. More particularly, copper pillars 128 formed at high stress locations have a greater longitudinal length than copper pillars 128 formed at other locations. In this manner, copper pillars 128 and solder joints 130 at high stress locations are stronger thus increasing reliability.

Further, UBM 858 is formed without adding additional process steps and thus without adding additional fabrication cost. Further, as copper pillars 128 do not melt, copper pillars 128 retain their shape and position on UBM 858.

Figure 10:
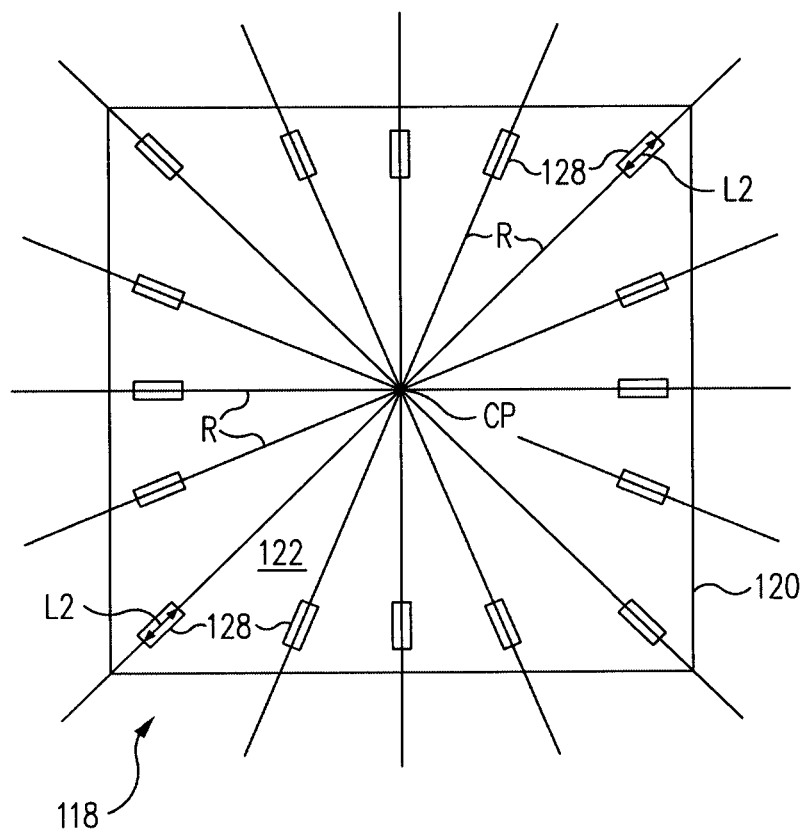
FIG. 10 is a top plan view of an active surface of an electronic component including copper pillars in accordance with another embodiment.

FIG. 10 is a top plan view of active surface 122 of electronic component 118 including copper pillars 128 in accordance with another embodiment. In accordance with this embodiment, the longitudinal length L2 of copper pillars 128 is positioned radially on radial lines R from the center CP of active surface 122 of electronic component 118. In this manner, longitudinal length L2 of copper pillars 128 is in line with the direction of maximum stress between electronic component 118 and substrate 102.

Bond pads 126 are not illustrated in FIG. 10 for simplicity of presentation although it is to be understood that copper pillars 128 are formed on bond pads 126. In one embodiment, the longitudinal length L3 (see FIG. 4 for example) of bond pads 126 is positioned radially on radial lines R from the center CP of active surface 122 of electronic component 118.

Although the orientation of copper pillars 128 as being perpendicular to outer periphery 120 of electronic component 118 is illustrated in FIGS. 1, 2 and as being positioned radially on radial lines R from the center CP of active surface 122 of electronic component 118 as illustrated in FIG. 10 is set forth, in light of this disclosure, those of skill in the art will understand that copper pillars 128 are formed in other orientations in other embodiments.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:
1. An electronic component package comprising:
a substrate comprising a first surface;

a first trace on the first surface, the first trace extending in a longitudinal direction, the first trace having a first latitudinal width in a latitudinal direction, the latitudinal direction being perpendicular to the longitudinal direction;

an electronic component comprising a bond pad;

a copper pillar attached to the bond pad, the copper pillar having a longitudinal length and a second latitudinal width, wherein the longitudinal length of the copper pillar is greater than the second latitudinal width of the copper pillar, the second latitudinal width of the copper pillar being equal to and aligned with the first latitudinal width of the first trace, the longitudinal length of the copper pillar being parallel with the longitudinal direction of the first trace and being in line with the direction of maximum stress between the electronic component and the substrate; and a solder joint mounting the copper pillar to the trace.

2. The electronic component package of claim 1 wherein the copper pillar is located within an area of the first trace.

3. The electronic component package of claim 2 wherein the copper pillar does not protrude in the latitudinal direction outwards beyond the first trace.

4. The electronic component package of claim 1 wherein the bond pad has a width and a length, the longitudinal length of the copper pillar being equal to the length of the bond pad, the second latitudinal width of the copper pillar being less than the width of the bond pad.

5. The electronic component package of claim 1 wherein the copper pillar is rectangular and comprises four straight sidewalls.

6. The electronic component package of claim 1 wherein the electronic component further comprises:

a passivation layer having an opening formed therein;

an Under Bump Metallization (UBM) connected to the bond pad through the opening in the passivation layer, wherein the UBM comprises:

a bond pad contact portion in contact with the bond pad at a first end of the UBM; and a UBM extension portion extending longitudinally on the passivation layer from the bond pad contact portion to a second end of the UBM, wherein the copper pillar and solder joint are formed on the UBM extension portion at the second end, the UBM attaching the copper pillar to the bond pad.

7. The electronic component package of claim 1 wherein the copper pillar is oval.

8. The electronic component package of claim 1 wherein the solder joint melts at a lower temperature than the copper pillar.

9. The electronic component package of claim 1 further comprising:

a solder mask on the first surface of the substrate, the first trace being exposed through a window of the solder mask.

10. The electronic component package of claim 9 wherein the solder mask comprises:

a central rectangular portion; and an outer rectangular annular portion, wherein the window is defined between the central rectangular portion and the outer rectangular annular portion.

11. The electronic component package of claim 1 further comprising:

a second trace on a second surface of the substrate; and a via electrically connecting the first trace with the second trace.

12. The electronic component package of claim 1 wherein the first trace comprises a substrate pad, the copper pillar being mounted to the substrate pad by the solder joint.

13. An electronic component package comprising:

a substrate comprising a first surface;

first traces on the first surface, the first traces extending in a longitudinal direction, the first traces having a first latitudinal width in a latitudinal direction, the latitudinal direction being perpendicular to the longitudinal direction;

an electronic component comprising at least two rows of staggered bond pads;

copper pillars formed directly on the staggered bond pads, wherein the copper pillars are rectangular, each copper pillar comprising four straight sidewalls extending perpendicularly from the respective staggered bond pad, the copper pillars having a longitudinal length and a second latitudinal width, the second latitudinal width of the copper pillars being equal to and aligned with the first latitudinal width of the first traces, the longitudinal length of the copper pillars being parallel with the longitudinal direction of the first traces; and solder joints mounting the copper pillars to the first traces.

14. The electronic component package of claim 13 wherein the at least two rows of staggered bond pads comprise:

an outer row of bond pads adjacent an outer periphery of the electronic component; and an inner row of bond pads inward of the outer row of bond pads.

15. The electronic component package of claim 14 wherein the outer row of bond pads is between the outer periphery of the electronic component and the inner row of bond pads.

16. The electronic component package of claim 13 wherein the bond pads of the outer row are mounted to every other of the first traces and wherein the bond pads of the inner row are mounted to every other of the first traces.

17. The electronic component package of claim 13 further comprising a solder mask comprising a window, wherein the first traces extend longitudinally across the window.

18. A method of forming an electronic component package comprising:

plating rectangular copper pillars directly on bond pads of an electronic component, each of the copper pillars comprising four straight sidewalls extending perpendicularly from the respective bond pad;

placing solder joints between first traces on a first surface of a substrate and the copper pillars, the first traces extending in a longitudinal direction, the first traces having a first latitudinal width in a latitudinal direction, the latitudinal direction being perpendicular to the longitudinal direction; and reflowing the solder joints to mount the copper pillars to the first traces, wherein the copper pillars do not melt during the reflowing, the copper pillars having a longitudinal length and a second latitudinal width, the second latitudinal width of the copper pillars being equal to and aligned with the first latitudinal width of the first traces, the longitudinal length of the copper pillars being parallel with the longitudinal direction of the first traces.

* * * * *